(12) United States Patent
Paterson et al.

(10) Patent No.: US 10,775,862 B2
(45) Date of Patent: Sep. 15, 2020

(54) RESET ISOLATION BRIDGE

(71) Applicant: ARM LIMITED, Cambridge (GB)

(72) Inventors: Richard Andrew Paterson, Thurgoland (GB); Christopher Vincent Severino, Haverhill (GB); Dominic William Brown, Ely (GB); Seow Chuan Lim, Letchworth Garden (GB); Csaba Kelemen, Gyor (HU); Gergely Kiss, Budapest (HU)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 16/638,839

(22) PCT Filed: Jul. 10, 2018

(86) PCT No.: PCT/GB2018/051947
§ 371 (c)(1),
(2) Date: Feb. 13, 2020

(87) PCT Pub. No.: WO2019/048816
PCT Pub. Date: Mar. 14, 2019

(65) Prior Publication Data
US 2020/0192447 A1   Jun. 18, 2020

(30) Foreign Application Priority Data
Sep. 6, 2017   (GB) .................................. 1714343.9

(51) Int. Cl.
*H03L 7/00*        (2006.01)
*G06F 1/24*        (2006.01)
(Continued)

(52) U.S. Cl.
CPC .............. *G06F 1/24* (2013.01); *G06F 1/3287* (2013.01); *H03K 19/0016* (2013.01)

(58) Field of Classification Search
CPC ...... H03K 17/223; H03K 17/22; H03K 5/135; H03K 3/0375; H03K 3/013; G06F 1/24; G06F 1/30
(Continued)

(56) References Cited

U.S. PATENT DOCUMENTS 9,407,264 B1     8/2016   Ali et al.
2005/0253462 A1  11/2005  Falkowski et al.
(Continued)

OTHER PUBLICATIONS

International Search Report and Written Opinion of the ISA for of PCT/GB2018/051947 dated Oct. 16, 2018, 16 pages.
Search Report for GB1714343.9 dated Feb. 13, 2018, 4 pages.

*Primary Examiner* — Anh Q Tra
(74) *Attorney, Agent, or Firm* — Nixon & Vanderhye P.C.

(57) ABSTRACT

An integrated circuit (2) has first and second domains (4). The first domain has a power controller (22) to control the power state of at least one device (20) in the second domain based on power management signals exchanged on a power management channel (24) between the first and second domains A reset isolation bridge (40) is provided on the power management channel (24) between the first and second domains (4). The bridge (40) has first and second interfaces (42, 44) to exchange the power management signals with the first and second domains respectively. Isolating circuitry (46) is provided in the bridge (40) to respond to a reset indication (8) indicating reset of one of the first and second domains, to isolate state transitions of the power management signals at the first and second interfaces (42, 44) from each other.

17 Claims, 9 Drawing Sheets

(51) Int. Cl.
*H03K 19/00* (2006.01)
*G06F 1/3287* (2019.01)

(58) Field of Classification Search
USPC .................................................. 327/142, 198
See application file for complete search history.

(56) References Cited

U.S. PATENT DOCUMENTS

| | | |
|---|---|---|
| 2010/0026258 A1 | 2/2010 | Satou |
| 2010/0042858 A1 | 2/2010 | Padhye et al. |
| 2012/0068539 A1 | 3/2012 | Shiotani |
| 2016/0085279 A1 | 3/2016 | Culshaw et al. |
| 2016/0091944 A1* | 3/2016 | Malmberg ............ G06F 1/3203 713/320 |
| 2016/0239060 A1* | 8/2016 | Koob ........................ G06F 1/26 |
| 2017/0235352 A1* | 8/2017 | Kumar ............... H03K 19/1776 713/330 |

* cited by examiner

| QREQn | QACCEPTn | QDENY | Interface state | Description |
| --- | --- | --- | --- | --- |
| 1 | 1 | 0 | Q_RUN | Device is operational. |
| 0 | 1 | 0 | Q_REQUEST | Device is operational, but requested to become quiescent when idle. |
| 0 | 0 | 0 | Q_STOPPED | Device has entered the quiescent state. This is the only state where the controller does not guarantee the availability of any resource managed by the interface. |
| 1 | 0 | 0 | Q_EXIT | Supply of clock or power is guaranteed. When the device acknowledges, by deasserting QACCEPTn HIGH, the state moves to Q_RUN. |
| 0 | 1 | 1 | Q_DENIED | Device denies request to become quiescent and remains operational. Controller must deassert QREQn. |
| 1 | 1 | 1 | Q_CONTINUE | Controller deasserts QREQn HIGH after Q_DENIED. Device is operational. |
| x | 0 | 1 | Unused (illegal) | - |

FIG. 7

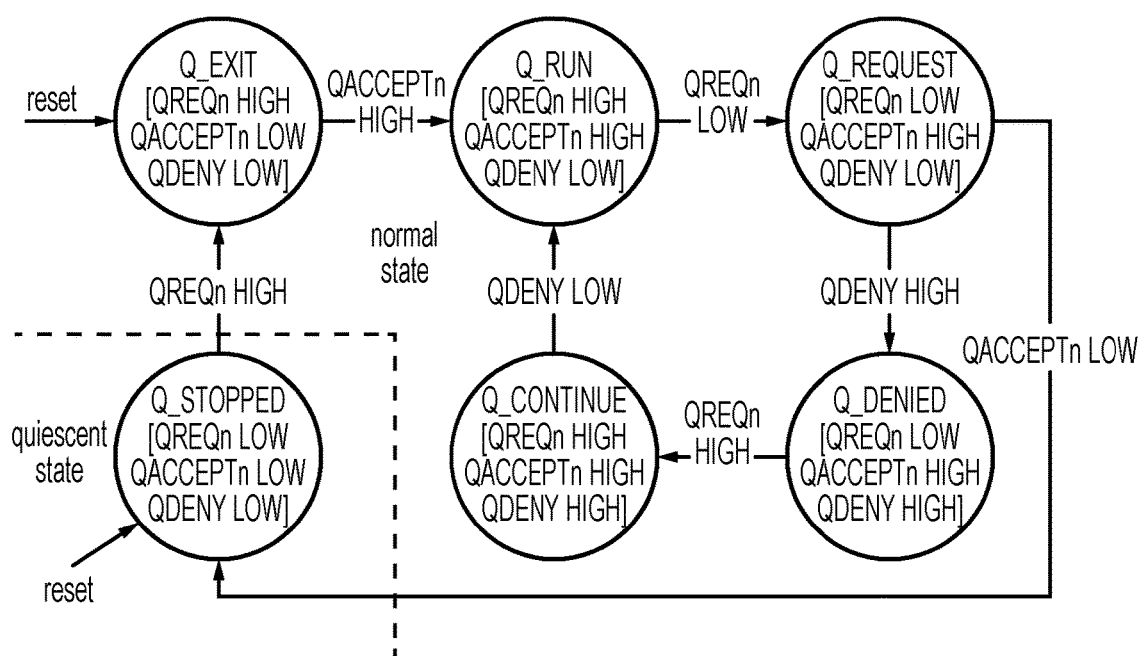

FIG. 8

| RESETn | PREQ | PACCEPT | PDENY | Interface state | Description |
|---|---|---|---|---|---|
| 0 | x | 0 | 0 | P_RESET | Device is in reset. |
| 1 | 0 | 0 | 0 | P_STABLE | Device state is stable. |
| 1 | 1 | 0 | 0 | P_REQUEST | Device is requested to transition to the state indicated by PSTATE. |
| 1 | 1 | 1 | 0 | P_ACCEPT | Device has accepted the request. Controller must set PACCEPT LOW. |
| 1 | 0 | 1 | 0 | P_COMPLETE | Controller has set PREQ LOW after P_ACCEPT. Device must set PACCEPT LOW. |
| 1 | 1 | 0 | 1 | P_DENIED | Device denies request and remains in the current state. Controller must set PREQ LOW. |
| 1 | 0 | 0 | 1 | P_CONTINUE | Controller sets PREQn LOW after P_DENIED. Device must set PDENY LOW. |
| x | x | 1 | 1 | Unused | Illegal signal combination. |

FIG. 13

RESET ISOLATION BRIDGE

This application is the U.S. national phase of International Application No. PCT/GB2018/051947 filed Jul. 10, 2018 which designated the U.S. and claims priority to GB Patent Application No. 1714343.9 filed Sep. 6, 2017, the entire contents of each of which are hereby incorporated by reference.

The present technique relates to the field of integrated circuits.

An integrated circuit may have a number of domains which may have separate power or clock supplies for example. The power state of one domain may be controlled based on power management signals exchanged over a power management channel with another domain.

At least some examples provide an integrated circuit comprising:
 a first domain; and
 a second domain;
 the first domain comprising a power controller to control a power state of at least one device in the second domain, based on power management signals exchanged over a power management channel between the first domain and the second domain; and
 a reset isolation bridge on the power management channel between the first domain and the second domain, the reset isolation bridge comprising:
  a first interface to exchange the power management signals with said power controller in the first domain;
  a second interface to exchange the power management signals with the second domain; and
  isolating circuitry responsive to a reset indication indicating occurrence of a reset event for resetting the first domain or the second domain to a predetermined reset state, to isolate state transitions of the power management signals at the first interface from state transitions of the power management signals at the second interface.

At least some examples provide a reset isolation bridge for a power management channel for exchanging power management signals between a first domain and a second domain of an integrated circuit; the reset isolation bridge comprising:
 a first interface to exchange power management signals with a power controller in the first domain for controlling a power state of at least one device in the second domain based on the power management signals;
 a second interface to exchange the power management signals with the second domain; and
 isolating circuitry responsive to a reset indication indicating occurrence of a reset event for resetting the first domain or the second domain to a predetermined reset state, to isolate state transitions of the power management signals at the first interface from state transitions of the power management signals at the second interface.

At least some example provide a power management method for an integrated circuit comprising a first domain and a second domain, the first domain comprising a power controller to control a power state of at least one device in the second domain, based on power management signals exchanged over a power management channel between the first domain and the second domain;
 the method comprising:
 exchanging the power management signals over the power management channel between the first domain and the second domain, the power management channel comprising a reset isolation bridge comprising a first interface to exchange the power management signals with said power controller in the first domain, and a second interface to exchange the power management signals with the second domain; and
 in response to a reset indication indicating occurrence of a reset event for resetting the first domain or the second domain to a predetermined reset state, the reset isolation bridge isolating state transitions of the power management signals at the first interface from state transitions of the power management signals at the second interface.

Further aspects, features and advantages of the present technique will be apparent from the following description of examples, which is to be read in conjunction with the accompanying drawings, in which:

FIG. 1 schematically illustrates an example of an integrated circuit comprising a number of domains;

FIG. 7 is a table summarising states of a power management channel between a device and the controller;

FIG. 8 is an example state diagram showing transitions between the states shown in FIG. 7;

FIGS. 12 to 14 show a second example of a protocol for managing a power state of a domain based on power management signals exchanged with another domain.

Figure 1:
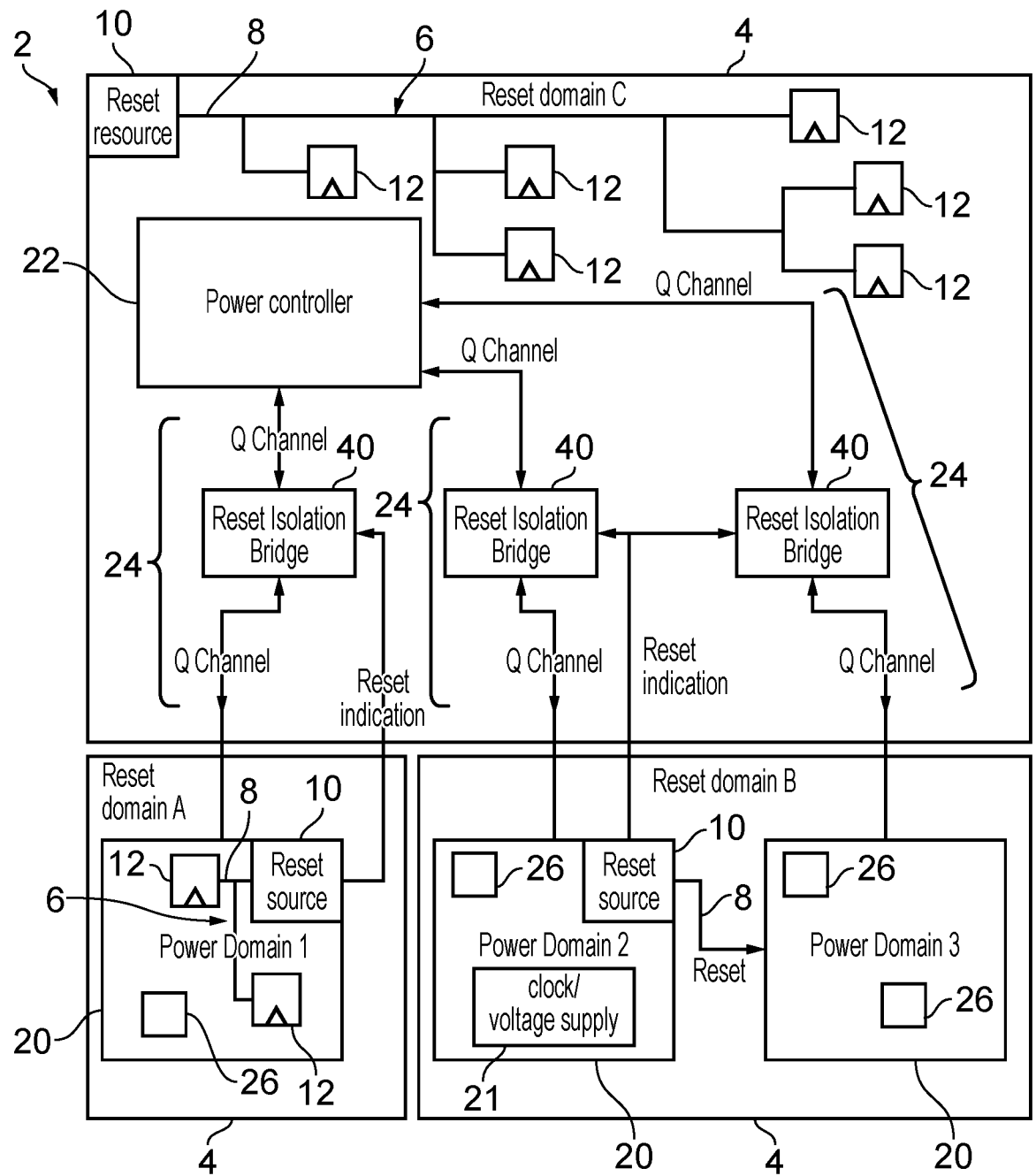

An integrated circuit may have a first domain and a second domain. The first domain may have a power controller for controlling a power state of at least one device in the second domain based on power management signals exchanged over a power management channel between the first and second domains. For example the first and second domains may be different power domains or different clock domains.

Some protocols for the power management signals on the power management channel may require that the power management channel transitions to a particular state when a reset event is asserted to reset one of the first domain or the second domain to a given reset state, and/or that certain state transitions of the power management signals are invalid. In practice, such restrictions mean that often it is not practical to reset only one of the first domain and the second domain, and so typically the whole system is reset at the same time. However, as system on chip integration gets larger, it can be advantageous for a system design to implement separate reset domains so that it is possible to reset one domain without resetting the other domain. For example, this could be useful if a particular portion of the integrated circuit encounters an error and so a reset of that portion is required, but resetting of another portion can be avoided to allow processing to continue on that other portion.

To address these issues, a reset isolation bridge may be provided on the power management channel between the first and second domains. The reset isolation bridge has a first interface to exchange the power management signals with the power controller in the first domain and a second interface to exchange the power management signals with the second domain. The reset isolation bridge also has isolating circuitry which is responsive to a reset indication indicating an occurrence of a reset event for resetting the first domain or the second domain to a predetermined reset state, to isolate state transitions of the power management signals at the first and second interfaces from each other. Hence, by providing a bridge to enable isolation of transitions in the power management signals on one side of the bridge from the transitions on the other side, it is possible to provide a reset of only one of the first and second domains, without breaching the power management protocol at the other domain. By supporting partial resets of selected domains of the integrated circuit, this can enable improved performance by allowing other domains to carry on processing when a given domain is reset.

The first domain may comprise a first reset tree and the second domain may comprise a second reset tree which is independent of the first reset tree. Hence, when a reset signal is supplied to the first reset tree, the second reset tree remains unaffected, and vice versa, so that independent resetting of each domain is provided. In this context, the reset tree refers to the network of wired connections which supply a reset signal from a reset source to a number of data storage elements to be reset to particular reset values.

Although the reset isolation bridge could be used to handle resets of either the first domain or the second domain, it can be particularly useful to provide a bridge which responds to occurrence of a reset event in the second domain to isolate the transitions in the power management signals at the first and second interfaces from each other. This is because it may be more likely that the second domain (comprising the devices whose power state is controlled by the power management channel) would be reset separately from the first domain (comprising the power controller), than the other way round. Hence, in some embodiments the reset isolation bridge need not support isolation in response to resets of both first and second domains. Some examples may only respond to a reset indication indicating occurrence of the reset event in the second domain, to isolate the state transitions of the power management signals on the first and second interfaces from each other.

In the absence of the reset indication indicating occurrence of the reset event, the isolating circuitry may propagate state transitions of the power management signals at one of the first and second interfaces to the other of the first and second interfaces. Hence, during normal non-reset states, power management signals may simply be passed across the bridge unchanged.

In contrast, once the reset indication is received, the transitions on either interface of the bridge are isolated from each other so that a change in the signals on one side of the bridge is not propagated through to the other side of the bridge.

Following receipt of the reset indication, the isolating circuitry of the bridge may trigger one or more state transitions of power management signals at one of the first and second interfaces during a reset isolation period until the power management signals at that one of the first and second interfaces match the state of the power management signals at the other of the first and second interfaces which were present at the time the reset indication was received. Hence, if a reset event on one side of the bridge results in a mismatch between the power management signals at the first and second interfaces, the bridge can trigger state transitions in the state machine associated with one of the sides of the bridge until the power management signals on both sides match again. Although the state transitions triggered by the isolating circuitry could be applied to either side of the bridge, it may be more efficient to apply those state transitions to the one of the first and second interfaces which corresponds to the domain which was reset (the "resetting domain") rather than the other domain (the "non-resetting domain") for which no reset has occurred. This enables the non-resetting domain to continue operating as if no change has occurred. Again, while the bridge could support resets on either side, in some embodiments the resets could always be at the second interface which triggers isolation of the power management signals, and in such embodiments the bridge-triggered state transitions could be applied to the second interface.

During the reset isolation period in which state transitions of a power management signals are isolated between the respective interfaces, the isolating circuitry may prevent transitions in the power management signals received at the other of the first and second interfaces (the opposite interface to the interface at which the state transitions are being triggered by the bridge) from propagating to the one of the first interface and second interface that is undergoing the bridge-triggered state transitions. Although in some cases the blocked state transitions could simply be ignored or discarded, in some examples the isolating circuitry may stall state transitions in the power management signals received from the other of the first and second interfaces, and then forward the stalled state transitions after the reset isolation period has ended. This avoids the domain which issued the stalled state transitions from having to repeat the same state transitions later.

The present technique can be used with a variety of power management protocols. However, it may be particularly useful for cases where the power management signals include at least one signal transmitted from the first domain to the second domain and at least one signal transmitted from the first domain to the second domain. For example, while the power controller in the first domain may transmit requests to enter or exit a particular power state to the second domain, the second domain could also transmit signals accepting or denying such requests or expressing a preference for whether the second domain should operate in a particular power state. When power management signals are being passed in both directions across the power management channel, the protocol for which state transitions of the power management signals are allowed may be more complex. For example, the reset event may trigger transition of the power management signals to a particular state, and the protocol may prescribe that certain state transitions of the power management signals are invalid, and so it is possible that a reset event could lead to a breach of the protocol by transitioning from one state of the power management channel to another which is not a valid transition in the protocol. Hence, providing the reset isolation bridge in a system using such a protocol can be advantageous to enable independent resetting of the first or second domains without either of the domains breaching protocol.

The power management signals could be used to control a range of types of power state. For example, the second domain may comprise a voltage supply and/or clock supply which controls supply of voltage and/or clock signals to at least one device in the second domain based on the power state. Some systems may support power management with two states (e.g. on/off or awake/asleep), while other systems may support more complex power management schemes with more than two states associated with different levels of power consumption (e.g. implemented with different amounts of clock gating or power gating), to enable more fine-grained trade-offs of the functionality available within the power domain and the amount of power consumed.

The second domain may not be the only domain whose power state is controlled by the power controller in the first domain. For example a further domain may be provided which may be controlled based on power management signals exchanged over a further power management channel between the first domain and the further domain. A further reset isolation bridge similar to the one discussed above may be provided on the further power management channel to enable resetting of the further domain independent of resetting of the first domain. However, the further domain and second domain may share a common reset so that the reset isolation bridge and the further reset isolation bridge on the respective power management channels for the second and further domains respectively may both respond to the same reset indication indicating resetting of both the second and the further domains to the reset state.

Alternatively, an additional domain may be provided which is again controlled based on power management signals exchanged over an additional power management channel between the first domain and the additional domain, and again has an additional reset isolation bridge on the additional power management channel. However, unlike the further domain discussed above, the additional domain could be reset independently from the second domain so that the additional reset bridge is responsive to an additional reset indication which is separate from the reset indication provided to the reset isolation bridge on the power management channel between the first and second domains.

FIG. 1 illustrates an example of an integrated circuit 2 which comprises a number of reset domains 4 (this example has three reset domains labelled A, B and C). Each reset domain 4 has a separate reset tree 6 for propagating a reset signal 8 from a reset source 10 within the domain to a number of storage elements 12 to be reset to particular reset values in response to assertion of the reset signal 8. Some data storage elements 12 may be reset high (1) while other storage elements may be reset low (0). For conciseness, the reset tree 6 is shown only for reset domains A and C in the example FIG. 1 and is omitted for reset domain B, but it will be appreciated that a similar reset tree 6 may be provided in domain B.

The integrated circuit 2 also includes a number of power domains 20 which can operate in two or more power states associated with different levels of power consumption. This example provides 3 power domains labelled 1, 2 and 3. A power controller 22 provided in an "always-on" power domain within reset domain C controls the power state of the respective power domains 20 based on power management signals exchanged with the respective domains over respective power management channels 24. For example, each power domain 20 may include a clock and/or voltage supply 21 (shown for conciseness only in power domain 2, although the other power domains 1 and 3 may also have the clock/voltage supply 21), which controls the supply of clock signals and/or voltage to devices within the corresponding domain based on the current power state. In this example power domains 2 and 3 are both within the same reset domain B so that a single reset signal 8 issued by the reset source 10 within domain B is propagated to both the power domains 2 and 3. On the other hand, power domain 1 is in reset domain A and so would be reset independently of power domains 2 and 3.

Each power management channel (or Q channel in this example) 24 exchanges a number of power management signals between the power controller 22 and devices in a corresponding power domain 20. The power management signals may include both signals sent from the power controller 22 to one or more devices 26 in the power domain being controlled, e.g. signals requesting certain entry/exit to or from a given power state, and signals transmitted from the device in the controlled power domain 20 back to the power controller 22, such a signal accepting or denying request to enter or exit a particular power state, or expressing a preference for operating in a particular state.

FIGS. 2 to 10 illustrates a first example of a power management protocol used on the Q channels 24, in which each power domain supports two different power states: a normal state and a quiescent state. The quiescent state may be any state in which power consumption is less than in the normal state. For example, in the quiescent state, supply of the clock signal and/or the voltage to devices within the corresponding power domain 20 may be suspended (control logic associated with controlling the clock/voltage supply and responding to the signals on the Q channel 24 may be implemented in an 'always-on' domain which is powered regardless of the current state of the rest of the corresponding power domain 20).

Figure 2:
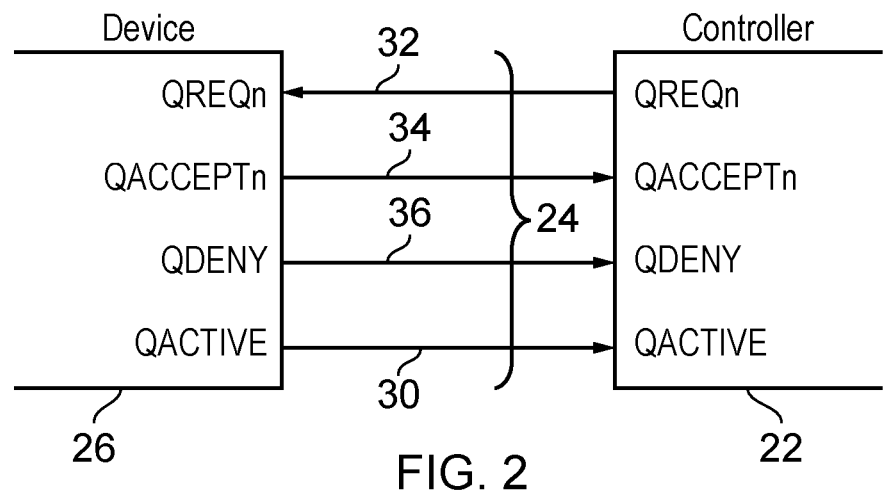
FIG. 2 shows an example of signals exchanged between a device and a controller for controlling transitions between the normal state and quiescent state.

FIG. 2 shows the signals transmitted on the Q channel 24 between a device 26 in the controlled power domain 20 and the controller 22. An active signal 30, referred to as QACTIVE, can be driven HIGH by a device 26 in any state to indicate that it has operations to perform. When QACTIVE is driven LOW by a device 26 it is a hint, not a guarantee, that the device might accept a quiescence request. The QACTIVE signal from a device can be composed from a number of source signals. To provide wake-up capabilities, these can include device input signals. The final QACTIVE signal is driven either directly by a register or by a number of registers whose outputs are combined using a logical OR. Some of the devices may have some circuitry which remains powered or clocked when the rest of the device is in the power saving state, for asserting the QACTIVE signal when the device needs to become operational again (e.g. when a request for activity is received from another device). For other devices, if the device 26 is itself unable to assert QACTIVE HIGH, in the absence of the resource managed according to the interface (e.g. when the device 26 is in the power saving state it may not be able to assert QACTIVE itself), there may be provided a system dependent method to facilitate wakeup outside of the device. For example, this could be a QACTIVE signal 30 from another device combined at the controller 22 with the device QACTIVE.

A handshake mechanism is provided to manage device quiescence and guarantees safe state transitions. The handshake signals include:

A quiescence request signal 32, QREQn, driven by the controller 22.

An acknowledgement signal pair including an accept signal 34, QACCEPTn, and a deny signal 36, QDENY, which are driven back to the controller 32 by the device 26 to indicate acceptance or denial of a request. The acknowledgement signals are organized such that only one of them changes per handshake transition. This allows the interface 24 to be implemented safely across asynchronous boundaries. QACCEPTn 34 is used to accept a request. QDENY 36 is used to deny a request. The QACCEPTn 34 and QDENY 36 signals from a device 26 and the QREQn signal 32 from a controller 22 are driven by registers. The denial mechanism means a device can maintain an operational state while having a mechanism by which it can promptly complete the handshake of a quiescence request. The polarities of the handshake signals are organized to provide a quiescent state where all the signals on the interface 24 are LOW. This facilitates simple default isolation rules.

The handshake signal states are independent of the state of QACTIVE 30. Therefore, transitions on QACTIVE 30 are not restricted by the values on QREQn 32 or on the QACCEPTn and QDENY output pair 34, 36. The controller 22 can guarantee clock supply or power availability according to the handshake interface state. Each of the signals 30, 32, 34, 36 is asynchronous.

Figure 3:
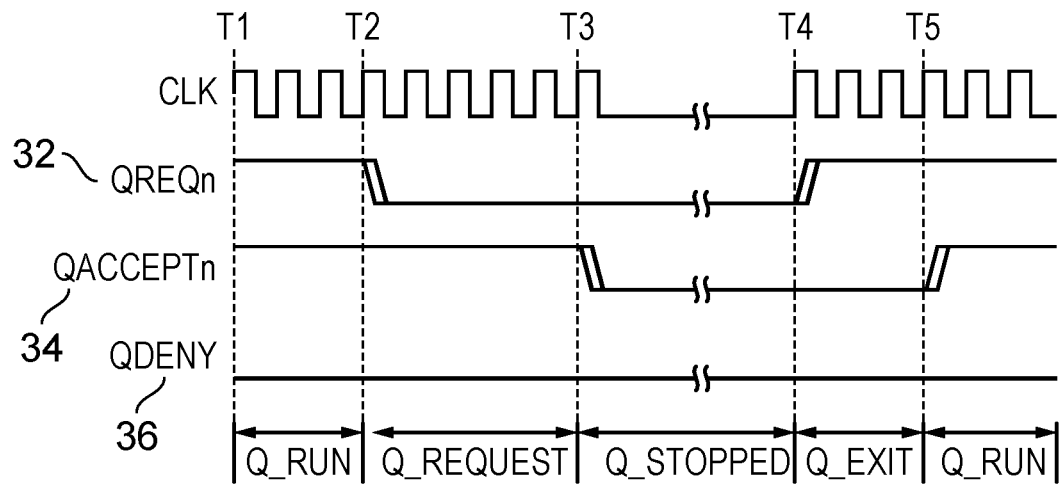
FIG. 3 shows an example of a device accepting a request to enter the quiescent state.

FIG. 3 shows a handshake sequence for an accepted quiescence request. It includes the activity of an optional controller-supplied clock that is managed according to the interface semantics. FIG. 3 omits QACTIVE 30 because, although QACTIVE 30 can act as a stimulus for the controller to change handshake state, it is independent of the handshake. All handshake state changes can be initiated by the controller 22 alone. The transitions shown in FIG. 3 are:

- At T1, QREQn 32 and QACCEPTn 34 are both HIGH. This state is referred to as Q_RUN and the device 26 in the controlled power domain 20 is operational. QDENY 36 is LOW in Q_RUN.
- At T2, QREQn 32 is driven LOW by the controller 22, requesting entry to a quiescent state. This state is referred to as Q_REQUEST. The device 26 remains operational.
- At T3, the device 26 responds to the quiescence request by driving QACCEPTn 34 LOW. QDENY 36 remains LOW. This state is referred to as Q_STOPPED. The device is not operational. This is the only state where the controller 22 does not guarantee the availability of any clock/power supply 21 that is managed using the Q channel interface 24. Hence, as shown in FIG. 3 between T3 and T4, the clock signal CLK to the device 26 may be stopped.
- At T4, the controller 22 drives QREQn 32 HIGH to request exit from the quiescent state. Both acknowledgement signals 34, 36 remain LOW. This state is referred to as Q_EXIT. Any clock or power supply managed by the interface is guaranteed after an implementation-dependent delay.
- At T5, the device responds to the controller with QACCEPTn 34 HIGH, and QDENY 36 remains LOW. The interface has returned to the state Q_RUN, as at T1.

Figure 4:
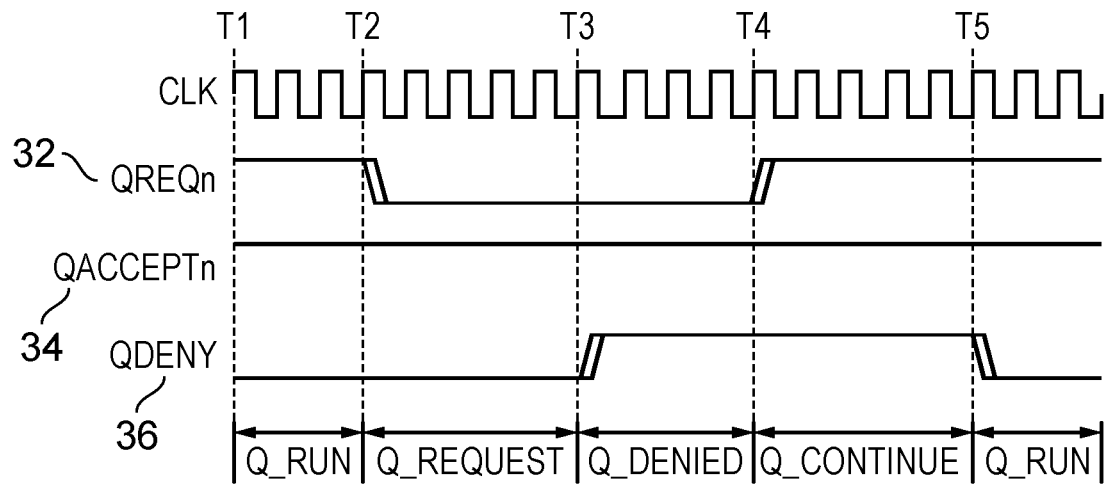
FIG. 4 shows an example of a device denying a request to enter the quiescent state.

FIG. 4 shows a handshake sequence for a denied quiescence request. It includes the activity of an optional controller-supplied clock that is managed according to the interface semantics.

The sequence from T1 to T2 is identical to that shown in FIG. 3.
- At T3 the device 26 drives QDENY 36 HIGH whilst QACCEPTn 34 remains HIGH. This state is referred to as Q_DENIED. The device 26 remains operational and the controller guarantees any clock or power supply managed by the interface. Hence, following T3 the clock CLK continues to be supplied.
- At T4 the controller 22 drives QREQn 32 HIGH. This state is referred to as Q_CONTINUE and is in response to the quiescence request denial at T3. The device remains operational.
- At T5 the device drives QDENY 36 LOW. The interface has returned to the state Q_RUN, as at T1.

Hence, by using the deny signal 36 the device 26 can deny a request to enter the quiescent state and can remain in the normal state.

Figure 5:
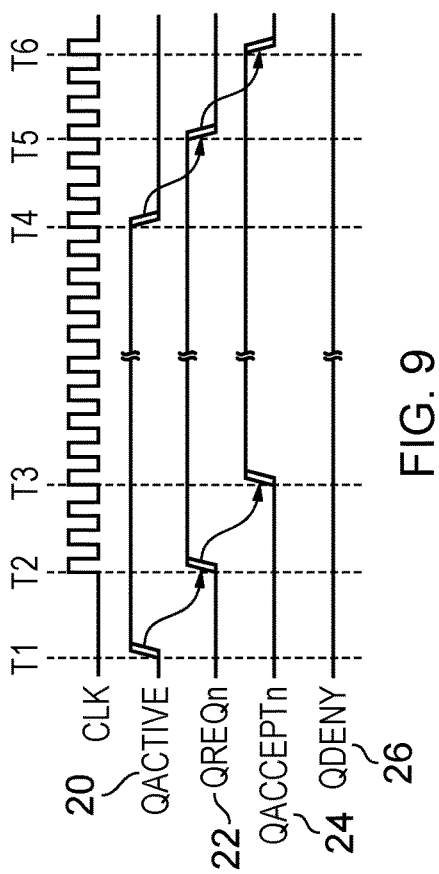
FIGS. 5 and 6 show examples of resetting a device.
Figure 6:
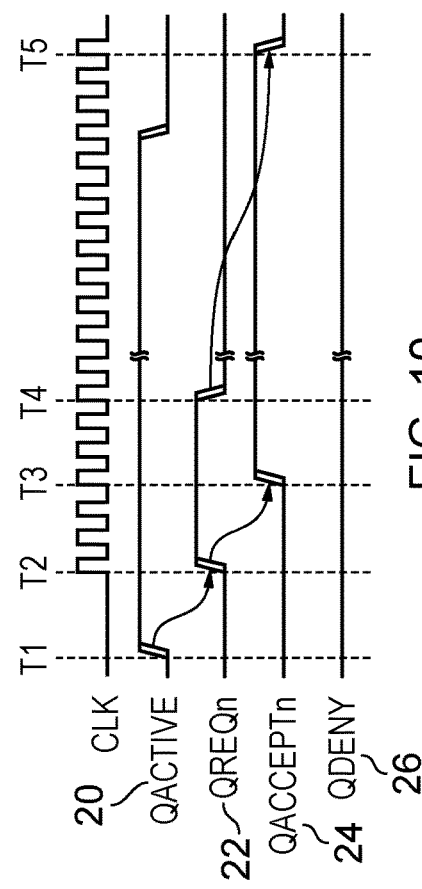

FIGS. 5 and 6 show examples of a procedure for device reset, which can be used to reset a device to a known state. The reset may be triggered by a reset signal 8 which may transmitted by the controller 22 or from a reset source 10 associated with the reset domain 4 comprising the controlled power domain 20. At reset assertion a device 26 may drive both QACCEPTn 34 and QDENY 36 LOW. QACTIVE 30 can reset LOW or HIGH. If the device needs to perform start-up operations on exit from reset then it can reset QACTIVE 30 HIGH, otherwise QACTIVE 30 may be reset LOW. A controller can release a device from reset with either: QREQn LOW, with the interface in Q_STOPPED state, or QREQn HIGH, with the interface in Q_EXIT state, provided any clock or power supply guarantee is met. A controller may only assert a device reset when the interface is in the Q_STOPPED state. This is consistent with the recommendation to isolate all signals LOW at power boundaries.

FIG. 5 shows a reset exit sequence into the Q_STOPPED state with QREQn LOW. At some time after reset deassertion the interface progresses to Q_RUN, possibly in response to a QACTIVE assertion. It then stays active for a time before re-entering the quiescent Q_STOPPED state, after which reset is asserted.

FIG. 6 shows a reset exit sequence into the Q_EXIT state with QREQn HIGH. Once the reset is released, the interface responds to the QREQn HIGH signal and progresses to Q_RUN. It then stays active for a time before re-entering the quiescent Q_STOPPED state, after which reset is asserted.

The table in FIG. 7 summarizes the interface states and device availability. If a device does not implement a denial mechanism, then QDENY is tied LOW or absent, and the first four states represent the complete set. FIG. 8 is a state diagram showing the possible handshake sequences in terms of the signal states and interface states.

The handshake signalling rules are:
- QREQn can only transition from HIGH to LOW when QACCEPTn is HIGH and QDENY is LOW.
- QREQn can only transition from LOW to HIGH when either:
  QACCEPTn and QDENY are both LOW.
  QACCEPTn and QDENY are both HIGH.
- QACCEPTn can only transition from HIGH to LOW when QREQn is LOW and QDENY is LOW.
- QACCEPTn can only transition from LOW to HIGH when QREQn is HIGH and QDENY is LOW.
- QDENY can only transition from HIGH to LOW when QREQn is HIGH and QACCEPTn is HIGH.
- QDENY can only transition from LOW to HIGH when QREQn is LOW and QACCEPTn is HIGH.

A controller 22 can make any policy decision concerning its management of QREQn irrespective of any activity on QACTIVE. However, some possible Q-Channel policies that provide useful solutions are described below.

Asserting QACTIVE HIGH can be used as a stimulus for the controller to exit the Q_STOPPED state. The controller 22 responds by driving QREQn HIGH, exiting the quiescent state.

Detecting QACTIVE LOW can be used, by a controller in the Q_RUN state, as a criterion for initiating a quiescence request. However, the controller can change the state of QREQn from HIGH to LOW at any time while it is in the Q_RUN state. Once QREQn is driven LOW, the controller does not have to consider the state of QACTIVE, because QREQn cannot be driven HIGH until the handshake is completed by the device with either an acceptance or denial response.

Figure 9:
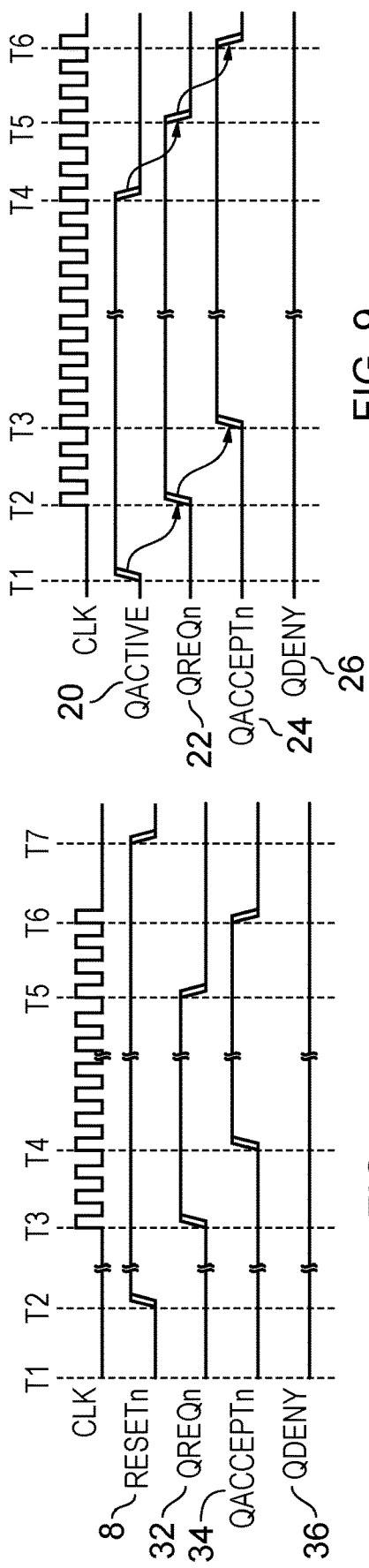
FIGS. 9 and 10 show examples of managing quiescent state entry or exit based on an active signal provided by the device.

FIG. 9 shows a controller policy led by device transitions on QACTIVE. When the interface is in Q_STOPPED state a HIGH level on QACTIVE stimulates an exit from the quiescent state. When the interface is in a Q_RUN state a LOW level on QACTIVE causes the controller to make a quiescence request.

Figure 10:
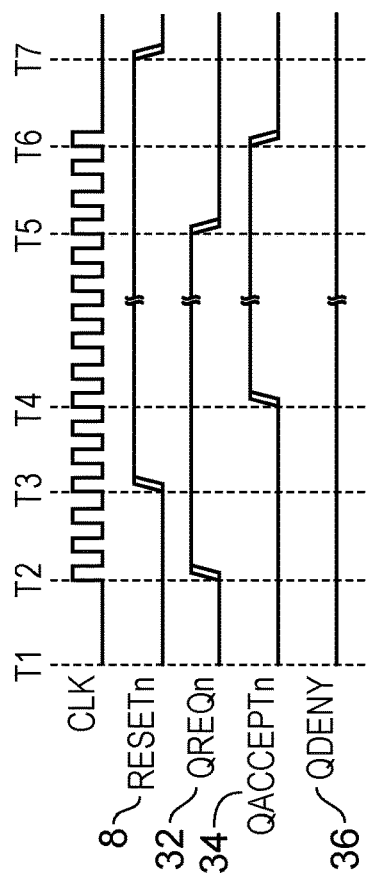

FIG. 10 shows a controller policy where the exit from quiescence is led by the device 26 but the entry is initiated by the controller 22. This might be a request for the device to complete its current actions, and not accept more, before becoming quiescent.

Some types of devices may not implement all of the signals of the Q channel as shown in FIG. 2. The following section describes the permitted signal subsets which a device may support:

Unused Interface

An unused interface has the QREQn input tied HIGH if the device is to be operational. The system has full responsibility for managing the availability of the device by means outside the interface control.

Omission of QDENY

A device that has no requirement to deny a quiescence request can omit QDENY with an implicit tie LOW. This subset also offers backward compatibility with devices that have no requirement to deny a quiescence request.

Omission of QACTIVE

In some applications the initiation of or exit from device quiescence might not require any information from the device. In this case, the device can omit QACTIVE. QACTIVE must be tied LOW at the controller.

QACTIVE-only interface

A device can present a minimum interface comprising only QACTIVE to indicate a requirement to perform operations, without any associated handshake. Typically this minimum interface might be used to provide an initial wakeup indication. However it does not provide any means to guarantee any clock or power availability. The indication provided by QACTIVE alone may be combined with other arrangements of either hardware, software, or both to provide working solutions.

Hence, reset assertion triggers a transition to the Q_STOPPED state, and reset deassertion may trigger a transition of the interface to the Q_EXIT or Q_STOPPED state. However, in systems having separate reset domains 4, a reset on one domain may cause transitions of the power management signals in that domain which if propagated to the other side of the Q channel in a different reset domain may lead to invalid transitions of the power management signals in the other domain not being reset, which violate the valid transitions shown in the state machine of FIG. 8. This has typically limited the ability to provide separate reset domains on either side of the Q channel.

Figure 11:
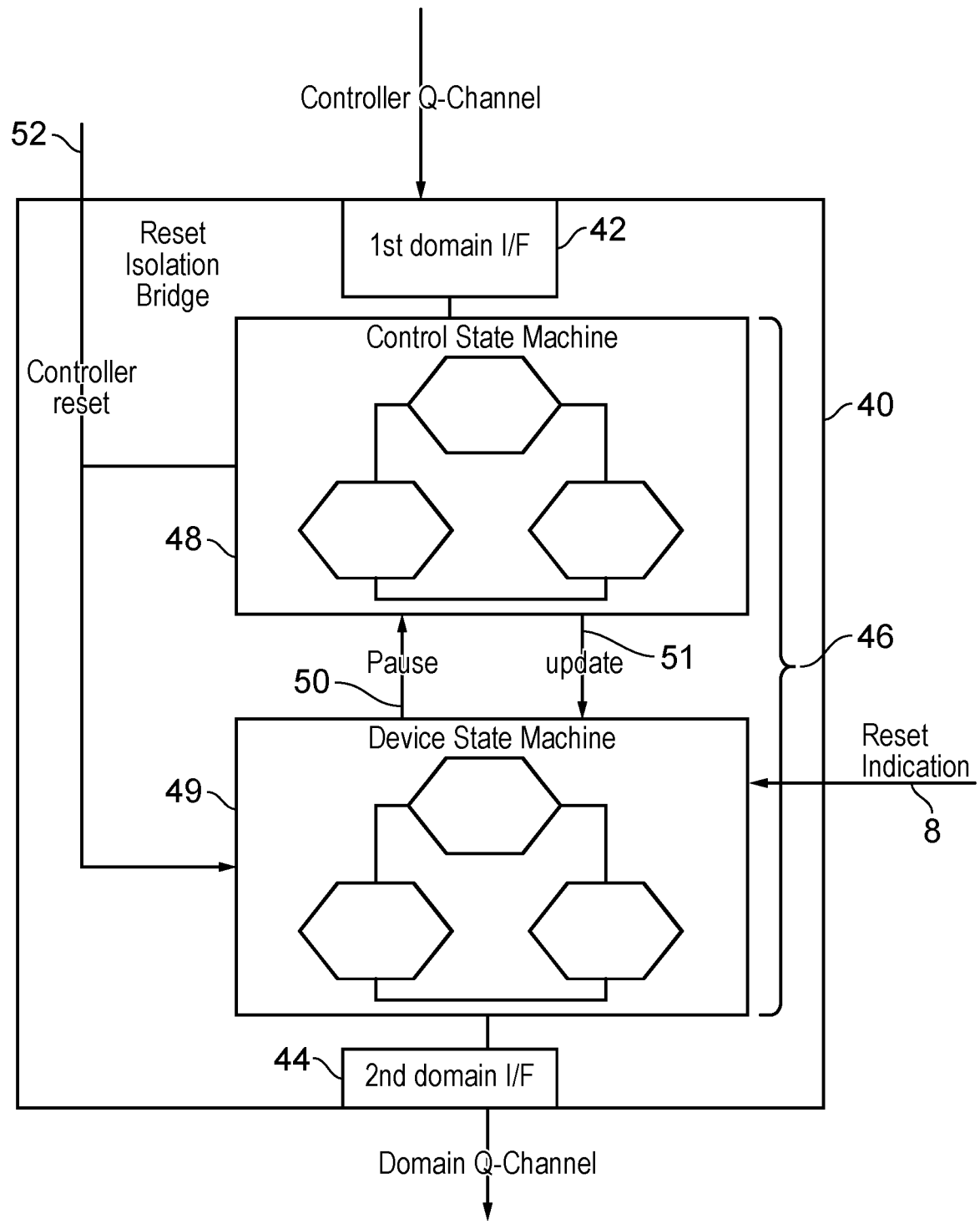
FIG. 11 shows an example of a reset isolation bridge.

To address this, a reset isolation bridge 40 is provided on each Q channel 24 which links a power controller 22 in a first reset domain 4 (e.g. reset domain C) with a power domain 20 in a second reset domain 4 (e.g. reset domain A or B). Power management channels which do not cross a reset domain boundary do not need such a reset isolation bridge 40. The reset isolation bridge is shown in more detail in FIG. 11. The reset isolation bridge has a first domain interface 42 for exchanging power management signals with the power controller 22 in the first reset domain C, and a second domain interface 44 for exchanging power management signals with a device 26 in the second reset domain A/B. The bridge 40 also has isolating circuitry 46 which responds to receipt of a reset indication 8 indicating that a reset has occurred in the second reset domain A/B, to isolate transitions in the power management signals at the first domain interface 42 and transitions in the power management signals at the second domain interface 44. Hence, even if the second (resetting) domain A/B is reset so that the signals at the second domain interface 44 change state, the signals at the first domain interface 42 may remain unchanged to prevent the first (non-resetting) domain C violating the power management protocol.

The isolating circuitry 46 may comprise first state machine control circuitry 48 and second state machine control circuitry 49 for controlling transitions of the signals on the first interface 42 and the second interface 44 respectively based on a corresponding state machine (for example the state machine shown in FIG. 8). In response to the reset indication 8 indicating a reset of the second domain, the isolating circuitry 46 generates a pause signal 50 for controlling the first state machine control circuitry 48 to pause transitions of the state machine associated with a first domain interface 42. Hence, even if the power controller 22 in the first reset domain C asserts changes in the power measurement signals received at the first domain interface 42, these may not trigger any updates to the first state machine 48 within the bridge or trigger propagation of state transitions through to the second reset domain A/B. During the reset isolation period, changes in states received at the first domain interface 42 may be stalled and then forwarded to the second reset domain A/B later once the reset isolation period has ended.

During the reset isolation period the first state machine control circuitry 48 may provide update signals 51 to the second state machine control circuitry 49 to trigger one or more state transitions of the second state machine until the second state machine matches the state of the first state machine representing the state of the signals on the first domain interface 42 at the time the reset indication 8 was received. For example, referring to FIG. 8, on reset exit the second domain may be in one of the Q_STOPPED and Q_EXIT states. However, if at the time of the reset the Q channel for the first domain was in one of the Q_RUN, Q_REQUEST, Q_DENIED or Q_CONTINUED states, then the first state machine control circuitry 48 in the bridge 40 may trigger the second state machine 49 to cycle through the sequence of states shown in FIG. 8 until the second state machine matches the first state machine. These transitions in second state machine state may be reflected in corresponding changes in the power management signals sent over the second domain interface 44 to the device 26 in the second reset domain A/B. Once both state machines match again then the reset isolation period may be ended and any stalled requests to change states from the power controller 22 in the first domain may then be forwarded to the second domain.

In some embodiments, a similar mechanism could be provided to respond to a reset of the first domain comprising the power controller 22, even if the second domain comprising the controlled power domain 20 is not being reset. However, in practice resetting a power controller 22 may be more likely if the entire system is being reset, and so it may not be justified to provide functionality for triggering state transitions in both directions. Hence in some examples a controller reset indication 52 indicating reset of the first domain C which comprises the power controller 22 may simply reset both controller and device state machines 48, 49 to a common reset state, so that on a first domain reset the state machines inherently match each other so no isolation is required.

Figure 12:
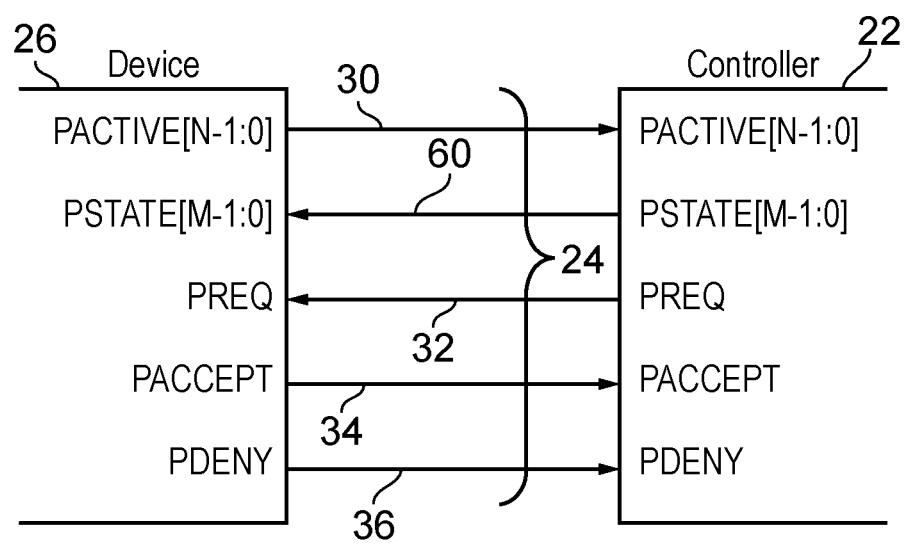
Figure 14:
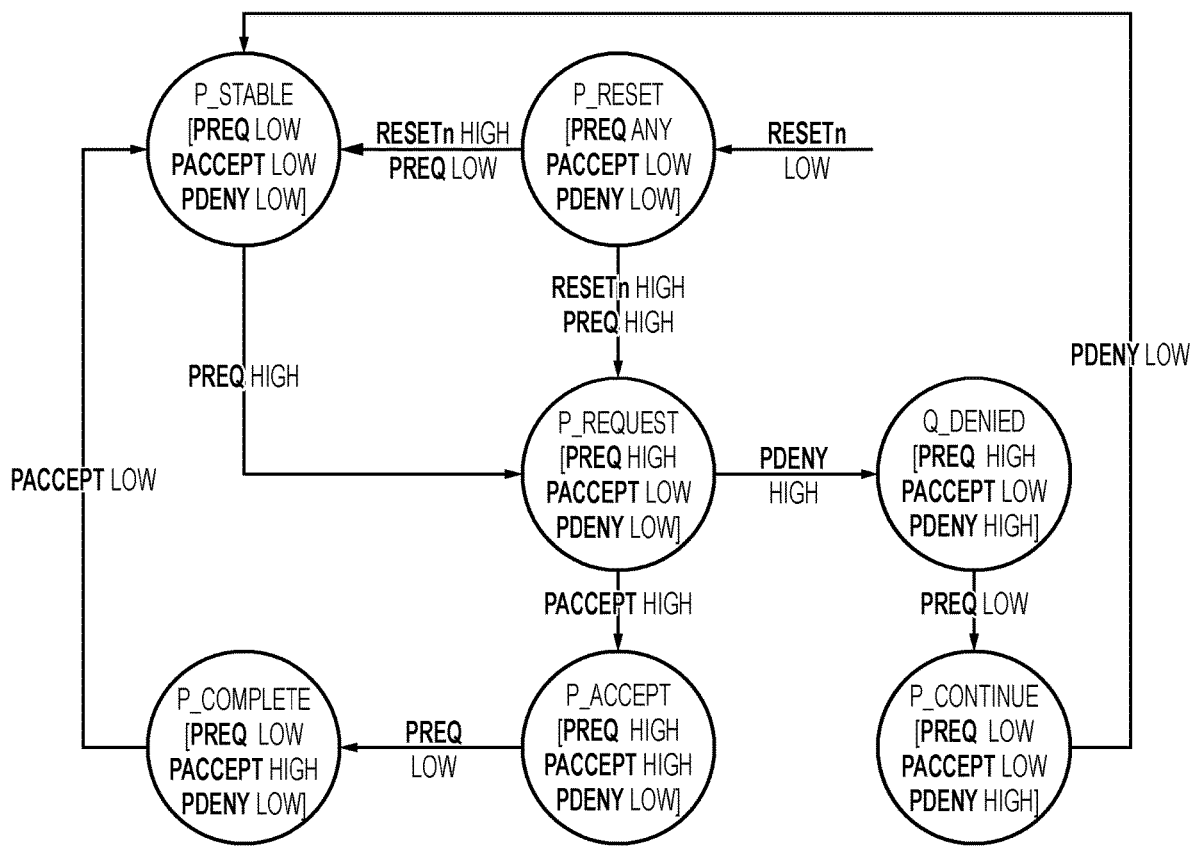

The Q channel power management protocol discussed with respect to FIGS. 2 to 10 is just one example of a power management protocol and the reset isolation bridge may be used for other protocols. FIGS. 12 to 14 illustrate a second example of a power management protocol. In this example, more than two power states are supported (the precise nature of the particular power states can vary from implementation to implementation, as the protocol provides a framework for communicating power state transitions regardless of the particular states provided). In this case, in addition to the request signal 32 used to request entry to a power state, the power controller 22 may also provide a power state identifier 60 which indicates which particular state the power controller 22 is requesting the device transitions to. As in FIG. 2, the device 26 being controlled by the power controller may still provide accept and deny signals 34, 36 to accept or deny the request to enter a given power state. Similarly, a PACTIVE signal 30 may be provided to express a preference as to whether devices should operate in a particular power state. FIG. 13 explains different states of the interface which use the protocol of this example and FIG. 14 is a state machine diagram illustrating valid transitions between these states. Hence, in another example the control state machines 48 and 49 of the reset isolation bridge 40 could operate according to the example of FIG. 14.

Figure 15:
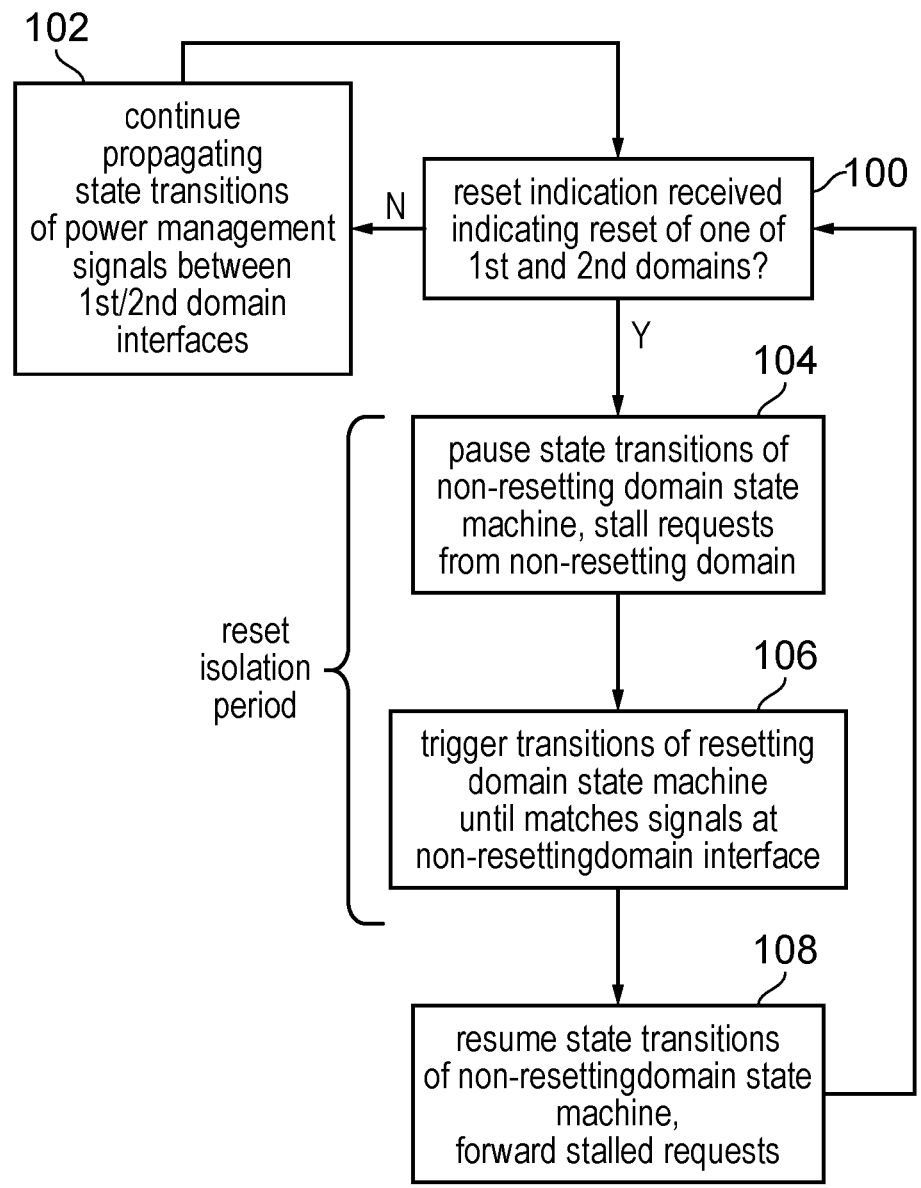
FIG. 15 is a flow diagram illustrating a method of isolating transitions in the power management signals at respective interfaces of the reset isolation bridge.

FIG. 15 is a flow diagram illustrating a method of isolating power signals on a power management channel using a reset isolation bridge 40. At step 100 the bridge 40 determines whether a reset indication 8 has been received indicating reset of one of the first domain C and second domains A/B between which the power management signals are being exchanged. If no reset indication has been received, then at step 102 the bridge 40 continues to propagate state transitions of power management signals between its first and second domain interfaces 42, 44. Hence, in the absence of a reset event, the reset isolation bridge 40 simply passes changes in power management signals across the bridge in a similar way to the case if the bridge was not provided at all.

When a reset indication is received at step 100, then at step 104 the bridge isolation circuitry 46 pauses state transitions of the state machine associated with the non-resetting domain (e.g. the domain C comprising the power controller 22), and stalls requests received from the non-resetting domain after the reset indication was asserted. At step 106 the isolating circuitry 46 triggers transitions of the resetting domain's state machine until the resetting domain's power management signals match the signals on the interface corresponding to the non-resetting domain. Once there is a match between the states reached by the respective state machines on either side of the bridge, then at step 108, state transitions of the non-resetting domain state machine are resumed and any stalled requests are forwarded to the resetting domain. The method then returns to step 100. Hence, during a reset isolation period from receipt of the reset indication to the point at which state machines on either side of the bridge match again, state transitions are stalled and the signals on either side of the bridge are isolated from one another to avoid breaches of power management protocol. This enables separate reset domains to be provided while still providing a power management channel which crosses the reset domain boundary.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An integrated circuit comprising:
   a first domain; and
   a second domain;
   the first domain comprising a power controller to control a power state of at least one device in the second domain, based on power management signals exchanged over a power management channel between the first domain and the second domain; and
   a reset isolation bridge on the power management channel between the first domain and the second domain, the reset isolation bridge comprising:
   a first interface to exchange the power management signals with said power controller in the first domain;
   a second interface to exchange the power management signals with the second domain; and
   isolating circuitry responsive to a reset indication indicating occurrence of a reset event for resetting the first domain or the second domain to a predetermined reset state, to isolate state transitions of the power management signals at the first interface from state transitions of the power management signals at the second interface.

2. The integrated circuit according to claim 1, wherein the first domain comprises a first reset tree and the second domain comprises a second reset tree independent of the first reset tree.

3. The integrated circuit according to claim 1, wherein the reset indication indicates occurrence of a reset event for resetting the second domain to the predetermined reset state.

4. The integrated circuit according to claim 1, wherein in the absence of the reset indication indicating occurrence of the reset event, the isolating circuitry is configured to propagate state transitions of the power management signals at one of the first interface and the second interface to the other of the first interface and the second interface.

5. The integrated circuit according to claim 1, wherein in response to the reset indication, the isolating circuitry is configured to trigger one or more state transitions of the power management signals at one of the first interface and the second interface during a reset isolation period until the power management signals at said one of the first interface and the second interface match the state of the power management signals at the other of the first interface and the second interface at the time the reset indication was received.

6. The integrated circuit according to claim 5, wherein said one of the first interface and the second interface comprises the one of the first interface and the second interface which corresponds to the one of the first domain and second domain to be reset to the predetermined reset state.

7. The integrated circuit according to claim 5, wherein said one of the first interface and the second interface comprises the second interface.

8. The integrated circuit according to claim 5, wherein the isolating circuitry is configured to prevent state transitions in the power management signals received at said other of the first interface and the second interface from propagating to said one of the first interface and the second interface during the reset isolation period.

9. The integrated circuit according to claim 5, wherein the isolating circuitry is configured to stall state transitions in the power management signals received at said other of the first interface and the second interface during the reset isolation period, and after the reset isolation period the isolating circuitry is configured to forward the stalled state transitions in the power management signals to said one of the first interface and the second interface.

10. The integrated circuit according to claim 1, wherein the power management signals include at least one signal transmitted from the first domain to the second domain and at least one signal transmitted from the second domain to the first domain.

11. The integrated circuit according to claim 1, wherein the power controller is configured to control the power state of said at least one device in the second domain based on the power management signals according to a predetermined power management protocol which specifies that at least one selected state transition of the power management signals is invalid.

12. The integrated circuit according to claim 1, comprising a voltage supply to control supply of voltage to said at least one device in the second domain in dependence on the power state.

13. The integrated circuit according to claim 1, comprising a clock supply to control supply of a clock signal to said at least one device in the second domain in dependence on the power state.

14. The integrated circuit according to claim 1, comprising a further domain, wherein the power controller is configured to control a power state of at least one device in the further domain based on power management signals exchanged over a further power management channel between the first domain and the further domain, and a further reset isolation bridge on the further power management channel;
wherein the reset isolation bridge and the further reset isolation bridge are both responsive to a same reset indication indicative of resetting of both the second domain and the further domain to the predetermined reset state.

15. The integrated circuit according to claim 1, comprising an additional domain, wherein the power controller is configured to control a power state of at least one device in the additional domain based on power management signals exchanged over an additional power management channel between the first domain and the additional domain, and an additional reset isolation bridge on the additional power management channel;
wherein the additional reset bridge is responsive to an additional reset indication indicative of resetting of the additional domain to the predetermined reset state, and said additional reset indication is separate from the reset indication provided to the reset isolation bridge on the power management channel between the first domain and the second domain.

16. A reset isolation bridge for a power management channel for exchanging power management signals between a first domain and a second domain of an integrated circuit; the reset isolation bridge comprising:
a first interface to exchange power management signals with a power controller in the first domain for controlling a power state of at least one device in the second domain based on the power management signals;
a second interface to exchange the power management signals with the second domain; and
isolating circuitry responsive to a reset indication indicating occurrence of a reset event for resetting the first domain or the second domain to a predetermined reset state, to isolate state transitions of the power management signals at the first interface from state transitions of the power management signals at the second interface.

17. A power management method for an integrated circuit comprising a first domain and a second domain, the first domain comprising a power controller to control a power state of at least one device in the second domain, based on power management signals exchanged over a power management channel between the first domain and the second domain;
the method comprising:
exchanging the power management signals over the power management channel between the first domain and the second domain, the power management channel comprising a reset isolation bridge comprising a first interface to exchange the power management signals with said power controller in the first domain, and a second interface to exchange the power management signals with the second domain; and
in response to a reset indication indicating occurrence of a reset event for resetting the first domain or the second domain to a predetermined reset state, the reset isolation bridge isolating state transitions of the power management signals at the first interface from state transitions of the power management signals at the second interface.

* * * * *